(12) United States Patent
Yang et al.

(10) Patent No.: US 12,501,674 B2
(45) Date of Patent: Dec. 16, 2025

(54) SILICON CARBIDE POWER SEMICONDUCTOR DEVICE HAVING REDUCED SPECIFIC ON-RESISTANCE

(71) Applicant: SILICON-MAGIC SEMICONDUCTOR TECHNOLOGY (HANGZHOU) CO., LTD., Hangzhou (CN)

(72) Inventors: Xiao Yang, Hangzhou (CN); Hui Chen, Hangzhou (CN)

(73) Assignee: Hangzhou Silicon-Magic Semiconductor Technology Co., Ltd., Hangzhou (CN)

( * ) Notice: Subject to any disclaimer, the term of this patent is extended or adjusted under 35 U.S.C. 154(b) by 669 days.

(21) Appl. No.: 17/931,034

(22) Filed: Sep. 9, 2022

(65) Prior Publication Data

US 2023/0117590 A1 Apr. 20, 2023

(30) Foreign Application Priority Data

Oct. 14, 2021 (CN) .......................... 202111197940.0

(51) Int. Cl.
*H10D 62/17* (2025.01)
*H10D 30/66* (2025.01)
*H10D 62/13* (2025.01)
*H10D 62/832* (2025.01)
*H10D 64/23* (2025.01)

(52) U.S. Cl.
CPC .......... *H10D 62/393* (2025.01); *H10D 30/66* (2025.01); *H10D 62/154* (2025.01); *H10D 62/8325* (2025.01); *H10D 64/252* (2025.01); *H10D 64/258* (2025.01)

(58) Field of Classification Search
CPC .... H10D 62/393; H10D 30/66; H10D 62/154; H10D 62/8325; H10D 64/252; H10D 64/258; H10D 30/662; H10D 62/126; H10D 62/157
USPC .......................... 257/77, 288, 262, 263, 266
See application file for complete search history.

(56) References Cited

U.S. PATENT DOCUMENTS

| | | | |
|---|---|---|---|
| 11,183,566 B1* | 11/2021 | Sundaresan | H10D 62/102 |
| 11,276,779 B1* | 3/2022 | Baliga | H10D 64/518 |
| 2015/0084066 A1* | 3/2015 | Banerjee | H10D 62/8325 |
| | | | 257/77 |

(Continued)

*Primary Examiner* — Mounir S Amer
*Assistant Examiner* — Nicholas B Michaud
(74) *Attorney, Agent, or Firm* — Osha Bergman Watanabe & Burton LLP

(57) ABSTRACT

A silicon carbide power semiconductor device is provided, including a substrate, a drift region, a body region, a source region, a base region, a shielding region, a JFET region, a gate structure, an insulating layer, and a source metal layer. The source contacting window has first edges within second edges of the body region corresponding to the first edges, and the source metal layer abuts only a part of the source region. The area of the silicon carbide power semiconductor device of the present disclosure is thus reduced. Therefore, the ratio of the channel length to the area of the silicon carbide power semiconductor device and the ratio of the area of the JFET region to the area of the silicon carbide power semiconductor device are increased, whereby the specific on-resistance of the silicon carbide power semiconductor device is reduced.

14 Claims, 3 Drawing Sheets

(56) References Cited

U.S. PATENT DOCUMENTS

2015/0372088 A1* 12/2015 Bolotnikov ........ H10D 30/0291
  438/510
2016/0336392 A1* 11/2016 Tominaga ............ H10D 62/157
2018/0337273 A1* 11/2018 Losee .................. H10D 62/393
2022/0262902 A1*  8/2022 Salemi ................ H10D 62/393

* cited by examiner

SILICON CARBIDE POWER SEMICONDUCTOR DEVICE HAVING REDUCED SPECIFIC ON-RESISTANCE

CROSS-REFERENCE TO RELATED APPLICATION

The present application claims priority from Chinese Patent Application No. CN202111197940A filed Oct. 14, 2021. The contents of which are incorporated herein in their entirety.

FIELD OF TECHNOLOGY

The present disclosure relates to the technical field of semiconductor device, and more particularly to a silicon carbide power semiconductor device.

BACKGROUND

The development of silicon-based electronic power devices has reached a bottleneck where it is difficult to meet requirements of electronic power systems on rectifying devices and switching devices in terms of super high voltage, high frequency and high temperature. As one of the third-generation semiconductor materials, silicon carbide has a band gap three times as large as that of silicon and a critical disruptive field ten times as strong as that of silicon. Moreover, silicon carbide has high saturated electron drift velocity and high thermal conductivity. Therefore, power devices made of silicon carbide have great advantages when applied in high-temperature, high-frequency, and high-power scenarios.

As silicon carbide metal oxide semiconductor field effect transistor (MOSFET) devices have the advantages of high input impedance and high switching speed, they are broadly applied in scenarios that require middle and low voltage or high switching frequency. However, as electronic power systems continuously develop, the blocking voltage of power devices also increases, exposing drawbacks of silicon carbide MOSFET devices. Most silicon carbide power semiconductor devices are unipolar, and therefore their on-resistance rapidly increases as their blocking resistance increases, and they also suffer from power loss and low system efficiency. Therefore, it is difficult to be applied in the technical field of ultra-high voltage. In contrast, for bipolar silicon carbide power devices, a conductance modulation effect will take place in the corresponding device's drift layer when the device is in an on state, reducing the on-resistance of the drift layer and the on-state voltage drop of the entire device.

However, existing silicon carbide power semiconductor devices have a low channel density, and a low junction field effect transistor (JFET) density, making it difficult to further reduce their on-resistance.

SUMMARY

The present disclosure provides a silicon carbide power semiconductor device, which includes: a substrate, which is of a first dopant type; a drift region disposed on the substrate, wherein the drift region is of the first dopant type; a body region disposed in the drift region, wherein the body region is of a second dopant type; a source region surrounding the body region, wherein the source region is of the first dopant type; a base region surrounding the source region, wherein the base region is of the second dopant type; a shielding region surrounding the body region and disposed under the source region and the base region, wherein the shielding region is of the second dopant type; a JFET region surrounding the base region and the shielding region; a gate structure formed above the JFET region, the base region and a part of the source region; an insulating layer, formed above the JFET region, the base region, and a part of the source region; a source contacting window, which penetrates the insulating layer, and has at least one first edge closer to a center of the body region than at least one second edge of the body region corresponding to the first edge; and a source metal layer, filled in the source contacting window.

In one or more embodiments, the source contacting window has two first edges closer to the center of the body region than two second edges of the body region corresponding to the first edges, and the source contacting window is symmetrical with respect to a central axis of the body region.

In one or more embodiments, the source contacting window has three first edges closer to the center of the body region than three second edges of the body region corresponding to the first edges.

In one or more embodiments, a distance between an edge of the body region and an inner edge of the gate structure ranges from 0.5 µm to 0.6 µm.

In one or more embodiments, a distance between an edge of the body region and an outer edge of the source region ranges from 1.0 µm to 1.1 µm.

In one or more embodiments, a distance between an edge of the source contacting window and an inner edge of the gate structure ranges from 0.8 µm to 0.9 µm.

In one or more embodiments, a distance between the body region and an edge of the source contacting window outside the body region ranges from 1.0 µm to 1.1 µm.

In one or more embodiments, a distance between an inner edge of the gate structure and an outer edge of the base region ranges from 1.0 µm to 1.1 µm.

In one or more embodiments, a distance between an outer edge of the source region and an outer edge of the base region ranges from 0.5 µm to 0.6 µm.

In one or more embodiments, a distance between an outer edge of the base region and an outer edge of the JFET region ranges from 0.5 µm to 0.6 µm.

In one or more embodiments, the body region has a width ranging from 1.8 µm to 2.0 µm.

In one or more embodiments, the body region has a doping concentration greater than that of the shielding region, and the shielding region has a doping concentration greater than that of the base region.

In one or more embodiments, the JFET region has a doping concentration greater than that of the drift region.

In one or more embodiments, the silicon carbide power semiconductor device has a channel density greater than or equal to 0.48 $\mu m^{-1}$, and a JFET density greater than or equal to 0.29, wherein the JFET region has a specific on-resistance smaller than or equal to 3.6 $m\Omega \cdot cm^2$.

The present disclosure accomplishes a silicon carbide power semiconductor device with a low specific on-resistance without changing the design rules of semiconductor devices. The source contacting window has the first edges within the second edges of the body region corresponding to the first edges, whereby the area of the source contacting window is reduced, and the source metal layer contacts only a part of the source region. As a result, the area of the silicon carbide power semiconductor device is t reduced, whereby the channel density and JFET density of the device are increased, thereby further reducing the specific on-resistance of the silicon carbide power semiconductor device.

DETAILED DESCRIPTION

Figure 1:
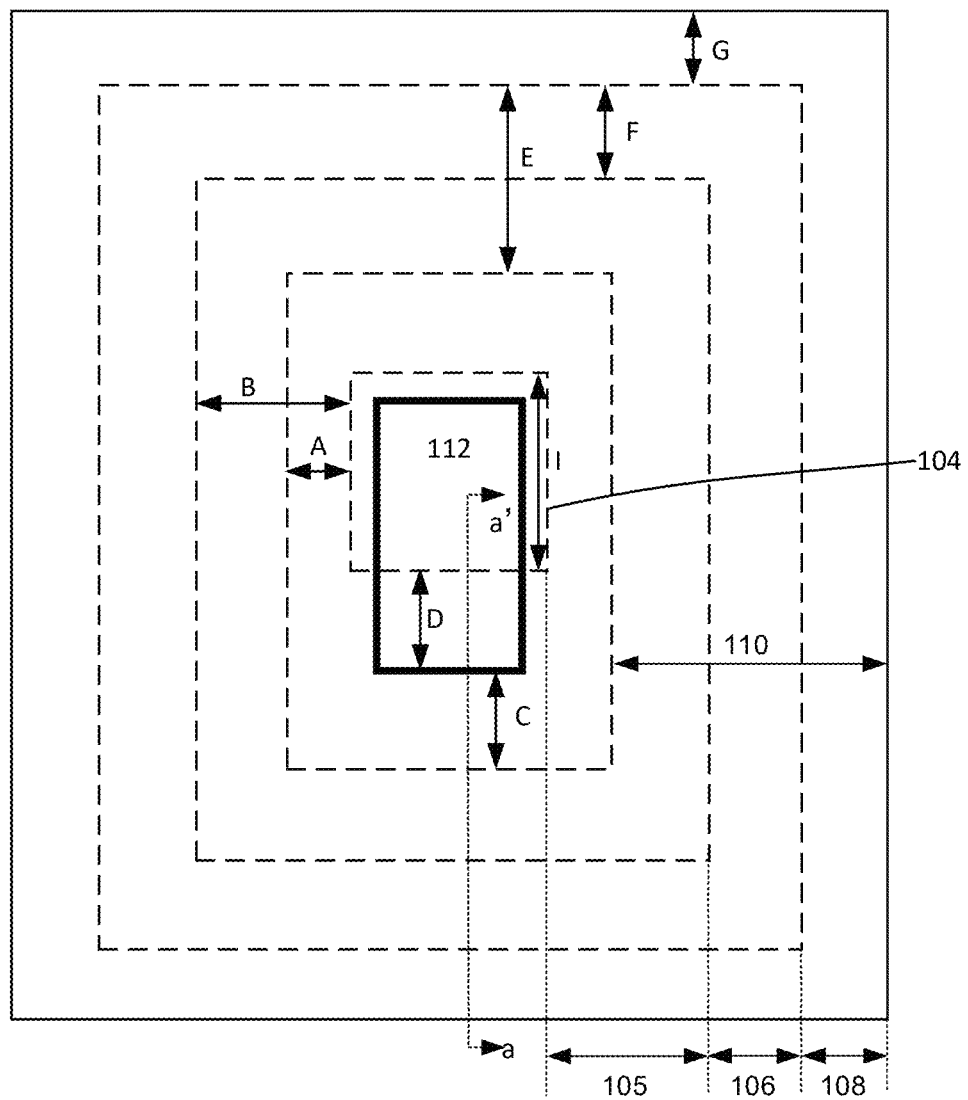
FIG. 1 is a schematic view of a design layout of a silicon carbide power semiconductor device according to a first embodiment of the present disclosure.

The embodiments of the present disclosure are described below through specific examples, and those ordinarily skilled in the art can easily understand other advantages and effects of the present disclosure from the contents disclosed in this specification. The present disclosure can also be implemented or applied through other different specific embodiments, and various details in this specification can also be modified or changed based on different viewpoints and applications without departing from the spirit of the present disclosure.

For example, when the embodiments of the present disclosure are described in detail, for ease of description, the cross-sectional view showing the device structure will not be partially enlarged according to the general scale, and the schematic diagram is only an example, which should not limit the scope of protection. In addition, the three-dimensional dimensions of length, width and depth should be included in the actual production.

For the convenience of description, spatial relation terms such as "below", "under", "beneath", "on", "above", "up", etc. may be used herein to describe the relationships between an element or feature and other elements or features. It will be understood that these spatial relationship terms are intended to encompass directions/orientations of the device in use or operation other than those depicted in the drawings.

In addition, when a first layer is referred to as being "between" a second layer and a third layer, the first layer may be the only layer between the second and third layers, or there may be more layers between the two layers. In the context of this disclosure, the structure described with a first feature "on top" of a second feature may include embodiments where the first and second features are formed in direct contact, or it may include embodiments where additional features are formed between the first and second features such that the first and second features are not in direct contact.

It should be noted that the drawings provided in this disclosure only illustrate the basic concept of the present invention in a schematic way, so the drawings only show the components related to the present invention. The drawings are not necessarily drawn according to the number, shape and size of the components in actual implementation; during the actual implementation, the type, quantity and proportion of each component can be modified as needed, and the components' layout may also be more complicated.

First Embodiment

Figure 2:
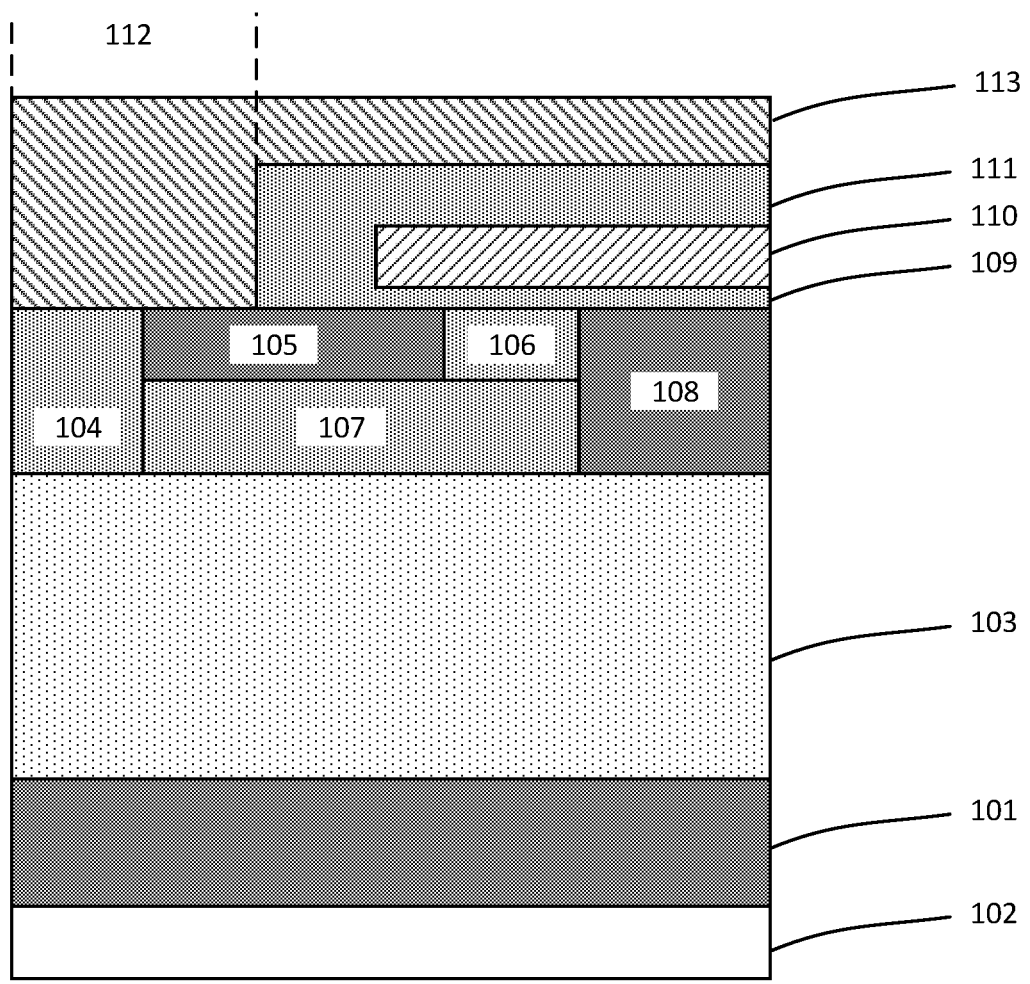
FIG. 2 is a cross-sectional view of the silicon carbide power semiconductor device according to the first embodiment of the present disclosure.

Referring to FIGS. 1 and 2. FIG. 2 is a cross-sectional view of the structure shown in FIG. 1 along the line a-a'; specifically, the cross-sectional plane passes through the line a-a' and is perpendicular to the page. The first embodiment provides a silicon carbide power semiconductor device. The silicon carbide power semiconductor device includes a substrate 101, which is of a first dopant type; a drift region 103, which is of the first dopant type; a body region 104, which is of a second dopant type; a source region 105, which is of the first dopant type; a base region 106, which is of the second dopant type; a JFET region 108; a shielding region 107, which is of the second dopant type; a gate structure; an insulating layer 111; and a source metal layer 113.

When the silicon carbide power semiconductor device is turned on, a proper voltage is applied to the gate structure, such as a voltage equal to or greater than a threshold voltage of the silicon carbide power semiconductor device, to generate an inversion layer in the channel region (i.e., the base region 106) which is under the gate structure, and also enhance conductive paths in the JFET region 108 by accumulating carriers for allowing currents to flow from a drain metal layer 102 toward the source metal layer 113, thereby turning on the silicon carbide power semiconductor device.

In one or more embodiments, the first dopant type is N-type, and the second dopant type is P-type. In one or more embodiments, the first dopant type is P-type, and the second dopant type is N-type.

As shown in FIG. 2, the substrate 101 is a heavily N-doped silicon carbide substrate with a thickness ranging from 300 μm to 400 μm and a resistivity of about 0.02 Ω·cm. The drain metal layer 102 is formed on a backside of the substrate 101, by a metal vapor sputtering process and an annealing process.

As shown in FIG. 2, the drift region 103 is formed on the substrate 101 by an epitaxy process. The drift region 103 has a doping concentration of $6 \times 10^{15} cm^{-3}$ to $9 \times 10^{15} cm^{-3}$, for example, $8 \times 10^{15} cm^{-3}$. The drift region 103 has a thickness of 8 μm to 12 μm, for example, 10 μm.

As shown in FIG. 2, in one or more embodiments, the body region 104 has a rectangular cross-section, and is formed in the drift region 103 by an ion implantation process. As shown in FIG. 1, in one or more embodiments, the body region 104 has the shape of a rectangle in a top view.

As shown in FIG. 2, the base region 106 has a rectangular cross-section, surrounding the source region 105, and may be formed by an ion implantation process. In one or more embodiments, the base region 106 has a thickness equal to that of the source region 105.

As shown in FIG. 1 and FIG. 2, the JFET region 108 has a rectangular cross-section, surrounding the base region 106, and may be formed by an ion implantation process. A bottom surface of the JFET region 108 is in contact with the drift region 103. In one or more embodiments, the doping concentration of the JFET region 108 is greater than that of the drift region 103. In one or more embodiments, the doping concentration of the JFET region 108 ranges from $3 \times 10^{16} cm^{-3}$ to $5 \times 10^{16} cm^{-3}$, for example $3 \times 10^{16} cm^{-3}$.

As shown in FIG. 2, the shielding region 107 is disposed under the source region 105 and the base region 106. The shielding region 107 has a rectangular cross-section, surrounding the body region 104, and may be formed by an ion implantation process.

In one or more embodiments, the body region 104 has a doping concentration greater than that of the shielding region 107, and the shielding region 107 has a doping concentration greater than that of the base region 106. For example, the body region 104 has a doping concentration of $5 \times 10^{19} cm^{-3}$, the shielding region 107 has a doping concentration of $5 \times 10^{19}$ cm$^{-3}$, and the base region 106 has a doping concentration of $9 \times 10^{18}$ cm$^{-3}$. The base region 106, the shielding region 107, and the body region 104 are all surrounding the source region 105. In one or more embodiments, bottom surfaces of the body region 104, the shielding region 107 and the JFET region 108 are aligned with each other.

As shown in FIG. 2, the gate structure is formed above the JFET region 108, the base region 106, and a part of the source region 105. That is, the front projection of the gate structure onto the substrate covers the JFET region 108 and the base region 106, and a part of the source region 105. In one or more embodiments, the gate structure includes a gate dielectric layer 109 and a polysilicon gate layer 110. For example, the gate dielectric layer 109 is formed by a thermal oxidation process or a deposition process, and the polysilicon gate layer 110 is formed by a deposition process. The gate structure may be further shaped by a photolithography process and an etching process.

As shown in FIG. 2, the insulating layer 111 is formed above the gate structure and a part of the source region 105. The insulating layer 111, for example, is a silicon dioxide layer, which may be formed by plasma-enhanced chemical vapor deposition or low-pressure chemical vapor deposition. The insulating layer 111 is penetrated by a source contacting window 112, which may be formed by etching. At least a first edge of the source contacting window 112 does not protrude a second edge of the body region 104 corresponding to the first edge, meaning the first edge is closer to the center of the body region 104 than the second edge. The second edge is an edge that is in the vicinity of the first edge and is parallel to the first edge. The source metal layer 113 is filled in the source contacting window 112.

For example, in one or more embodiments, as shown in FIG. 1, the source contacting window 112 has three first edges that do not protrude three second edges of the body region 104 respectively corresponding to the three first edges. By designing the source contacting window 112 with three first edges that do not protrude the three second edges of the body region 104, the dimensions of the source contacting window 112 are substantially reduced, which in turn reduces the dimensions of the silicon carbide power semiconductor device.

As shown in the non-limiting example of FIG. 2, each of the source region 105, the base region 106, the shielding region 107, the JFET region 108, the gate structure, the insulating layer 111, and the source metal layer 114 has an inner boundary and an outer boundary; each inner boundary consists of at least three inner edges, and each outer boundary consists of at least three outer edges. As an example, the inner boundaries and outer boundaries are all rectangular and each of them consists of four edges.

In one or more embodiments, a distance A between an edge of the body region 104 and an inner edge of the gate structure ranges from 0.5 µm to 0.6 µm. A distance B between an edge of the body region 104 and an outer edge of the source region 105 ranges from 1.0 µm to 1.1 µm. A distance C between an edge of the source contacting window 112 and an inner edge of the gate structure ranges from 0.8 µm to 0.9 µm. A distance D between the body region 104 and an edge of the source contacting window 112 outside the body region 104 ranges from 1.0 µm to 1.1 µm. A distance E between an inner edge of the gate structure and an outer edge of the base region 106 ranges from 1.0 µm to 1.1 µm. A distance F between an outer edge of the source region 105 and an outer edge of the base region 106 ranges from 0.5 µm to 0.6 µm. A distance G between an outer edge of the base region 106 and an outer edge of the JFET region 108 ranges from 0.5 µm to 0.6 µm. The body region 104 has a width I ranging from 1.8 µm to 2.0 µm.

In one or more embodiments, the distance A between an edge of the body region 104 and an inner edge of the gate structure is 0.5 µm; the distance B between an edge of the body region 104 and an outer edge of the source region 105 is 1.0 µm; the distance C between an edge of the source contacting window 112 and an inner edge of the gate structure is 0.8 µm; the distance D between an edge of the source contacting window 112 exceeding the body region 104 and the body region 104 is 1.0 µm; the distance E between an inner edge of the gate structure and an outer edge of the base region 106 is 1.0 µm; the distance F between an outer edge of the source region 105 and an outer edge of the base region 106 is 0.5 µm; the distance G between an outer edge of the base region 106 and an outer edge of the JFET region 108 is 0.5 µm. The width I of the body region 104 is 1.8 µm. In one or more embodiments, the dimensions of the silicon carbide power semiconductor device can be reduced to 6.0 µm×6.7 µm (W*L).

In one or more embodiments, since the source contacting window 112 has three first edges within the second edges of the body region 104 corresponding to the first edges. The distance A between the edge of the body region 104 and an inner edge of the gate structure, and the distance B between the outer edge of the body region 104 and the outer edge of the source region 105 are substantially reduced, whereby the area of the silicon carbide power semiconductor device is substantially reduced. At the same time, the distance F (i.e., the length of the channel) between the outer edge of the source region 105 and the outer edge of the base region 106 and the distance G between the outer edge of the base region 106 and the outer edge of the JFET region 108 do not change substantially. As a result, the ratio of the length of the channel to the area of the silicon carbide power semiconductor device (i.e., channel density) and the ratio of the area of the JFET region 108 to the area of the silicon carbide power semiconductor device (i.e., JFET density) are both increased. The specific on-resistance of the silicon carbide power semiconductor device is thus reduced. Herein, the "area of the silicon carbide power semiconductor device" refers to the area of the front projection of the silicon carbide power semiconductor device onto the substrate 101; the "area of the JFET region" refers to the area of the front projection of the JFET region 108 onto the substrate 101.

In one or more embodiments, by adopting the above designs, the channel density of the silicon carbide power semiconductor device can be greater than or equal to 0.48 µm$^{-1}$, the JFET density can be greater than or equal to 0.29, and the specific on-resistance of the JFET region 108 can be smaller than or equal to 3.6 mΩ·cm$^2$.

Second Embodiment

Figure 3:
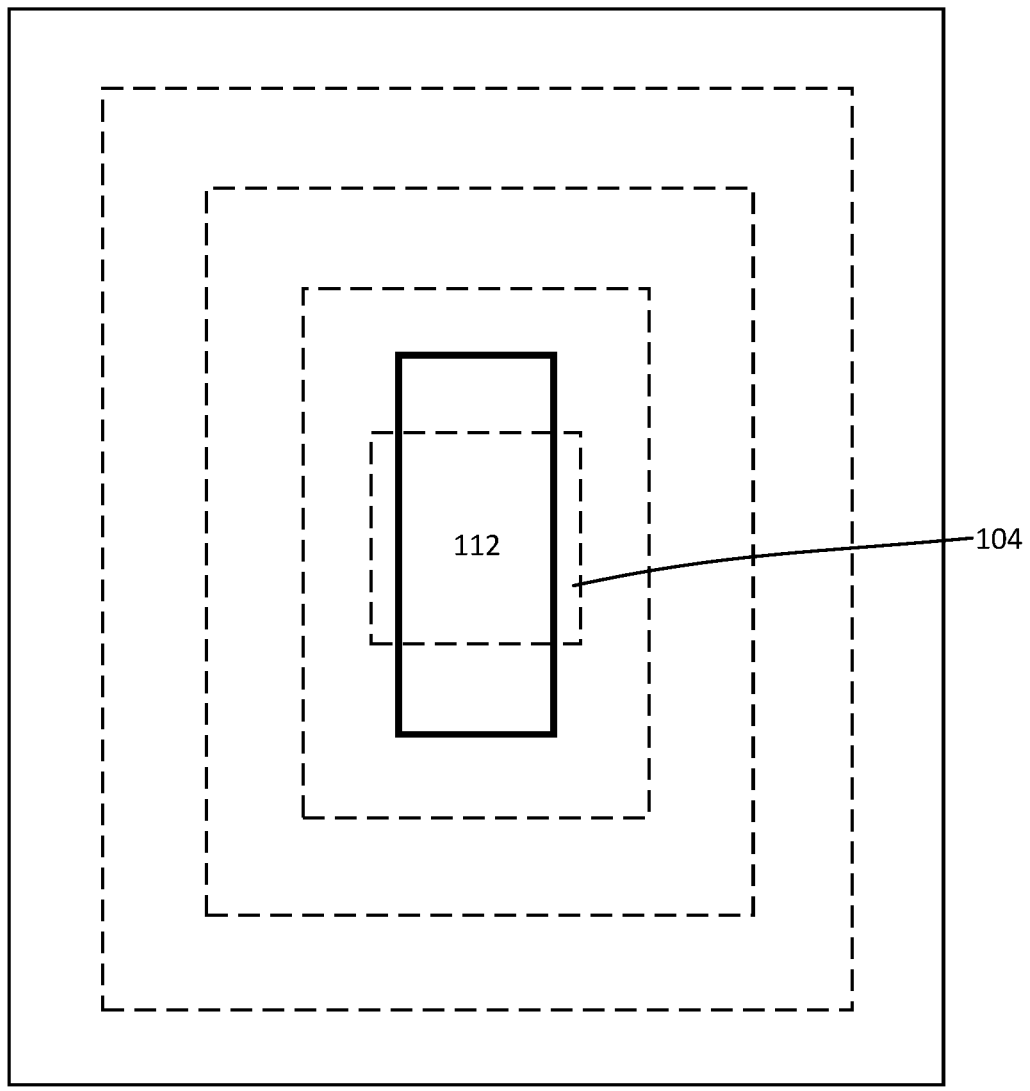
FIG. 3 is a schematic view of a design layout of a silicon carbide power semiconductor device according to a second embodiment of the present disclosure.

As shown in FIG. 3, the second embodiment provides a silicon carbide power semiconductor device, which shares the basic structure with the first embodiment. The second embodiment differs from the first embodiment in that the source contacting window 112 in the second embodiment has two first edges within the second edges of the body region 104 corresponding to the first edges, and the source contacting window 112 is symmetrical with respect to a central axis of the body region 104.

In the second embodiment, the distance A between an outer edge of the body region 104 and an inner edge of the gate structure, and the distance B between an outer edge of the body region 104 and an outer edge of the source region 105 are also reduced to increase the channel density and JFET density and thus reduce the specific on-resistance of the silicon carbide power semiconductor device. Furthermore, as the source contacting window 112 is symmetrical with respect to the central axe of the body region 104, larger currents with better symmetry are provided for the source region 105, thereby improving the uniformity of the currents and on-state performance of the silicon carbide power semiconductor device.

The silicon carbide power semiconductor device of the present disclosure has the following advantageous effects:

The present disclosure provides a silicon carbide power semiconductor device with a low specific on-resistance without changing the design rules of semiconductor devices. The source contacting window has at least one first edge within the corresponding second edges of the body region, thereby the area of the source contacting window is reduced, and the source metal layer contacts only a part of the source region. As a result, the area of the silicon carbide power semiconductor device is reduced, whereby the channel density and JFET density of the device are increased, thereby further reducing the specific on-resistance of the silicon carbide power semiconductor device.

Therefore, the present disclosure effectively overcomes various drawbacks of the related art and has a high industrial value.

The above embodiments are illustrative of the principles and benefits of the disclosure rather than restrictive of the scope of the disclosure. Persons skilled in the art can make modifications and changes to the embodiments without departing from the spirit and scope of the disclosure. Therefore, all equivalent modifications and changes made by persons skilled in the art without departing from the spirit and technical concepts disclosed in the disclosure shall still be deemed falling within the scope of the claims of the disclosure.

What is claimed is:

1. A silicon carbide power semiconductor device, comprising:
   a substrate, which is of a first dopant type;
   a drift region disposed on the substrate, wherein the drift region is of the first dopant type;
   a body region disposed in the drift region, which is of a second dopant type;
   a source region surrounding the body region, wherein the source region is of the first dopant type;
   a base region surrounding the source region, wherein the base region is of the second dopant type;
   a shielding region surrounding the body region and disposed under the source region and the base region, wherein the shielding region is of the second dopant type;
   a junction field effect transistor (JFET) region surrounding the base region and the shielding region;
   a gate structure formed above the JFET region, the base region and a part of the source region;
   an insulating layer, formed above the JFET region, the base region, and a part of the source region;
   a source contacting window, which penetrates the insulating layer, and has at least one first edge closer to a center of the body region than at least one second edge of the body region that is parallel to the first edge; and
   a source metal layer, filled in the source contacting window.

2. The silicon carbide power semiconductor device according to claim 1, wherein the source contacting window has two first edges closer to the center of the body region than two second edges of the body region corresponding to the first edges, and the source contacting window is symmetrical with respect to an axis of the body region.

3. The silicon carbide power semiconductor device according to claim 1, wherein the source contacting window has three first edges closer to the center of the body region than three second edges of the body region corresponding to the first edges.

4. The silicon carbide power semiconductor device according to claim 1, wherein a distance between an edge of the body region and an inner edge of the gate structure ranges from 0.5 µm to 0.6 µm.

5. The silicon carbide power semiconductor device according to claim 1, wherein a distance between an edge of the body region and an outer edge of the source region ranges from 1.0 µm to 1.1 µm.

6. The silicon carbide power semiconductor device according to claim 1, wherein a distance between an edge of the source contacting window and an inner edge of the gate structure ranges from 0.8 µm to 0.9 µm.

7. The silicon carbide power semiconductor device according to claim 1, wherein a distance between the body region and an edge of the source contacting window outside the body region ranges from 1.0 µm to 1.1 µm.

8. The silicon carbide power semiconductor device according to claim 1, wherein a distance between an inner edge of the gate structure and an outer edge of the base region ranges from 1.0 µm to 1.1 µm.

9. The silicon carbide power semiconductor device according to claim 1, wherein a distance between an outer edge of the source region and an outer edge of the base region ranges from 0.5 µm to 0.6 µm.

10. The silicon carbide power semiconductor device according to claim 1, wherein a distance between an outer edge of the base region and an outer edge of the JFET region ranges from 0.5 µm to 0.6 µm.

11. The silicon carbide power semiconductor device according to claim 1, wherein the body region has a width ranging from 1.8 µm to 2.0 µm.

12. The silicon carbide power semiconductor device according to claim 1, wherein the body region has a doping concentration greater than that of the shielding region, and the shielding region has a doping concentration greater than that of the base region.

13. The silicon carbide power semiconductor device according to claim 1, wherein the JFET region has a doping concentration greater than that of the drift region.

14. The silicon carbide power semiconductor device according to claim 1, wherein the silicon carbide power semiconductor device has a channel density greater than or equal to $0.48\ \mu m^{-1}$, and a JFET density greater than or equal to 0.29, wherein the JFET region has a specific on-resistance smaller than or equal to $3.6\ m\Omega \cdot cm^2$.

* * * * *